(12) United States Patent
Vemula et al.

(10) Patent No.: US 7,196,948 B1
(45) Date of Patent: Mar. 27, 2007

(54) METHOD AND APPARATUS FOR DATA CAPTURE ON A BI-DIRECTIONAL BUS

(75) Inventors: Sunil K. Vemula, Sunnyvale, CA (US); Francis X. Schumacher, Palo Alto, CA (US); Ian P. Shaeffer, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 11/074,462

(22) Filed: Mar. 7, 2005

(51) Int. Cl.
*G11C 7/00* (2006.01)

(52) U.S. Cl. .................. 365/193; 365/191; 365/194; 365/233

(58) Field of Classification Search ............ 365/193, 365/194, 191
See application file for complete search history.

(56) References Cited

U.S. PATENT DOCUMENTS

| | | | |
|---|---|---|---|
| 6,453,402 B1 * | 9/2002 | Jeddeloh | 711/167 |
| 6,456,544 B1 * | 9/2002 | Zumkehr | 365/193 |
| 6,615,331 B1 * | 9/2003 | Morzano | 711/167 |
| 6,665,230 B1 * | 12/2003 | Shrader et al. | 365/233 |
| 6,990,562 B2 * | 1/2006 | Rentschler et al. | 711/154 |

OTHER PUBLICATIONS

"Clock Domain Crossing: closing the loop on clock domain functional implementation problems", 2004, Cadence, http://www.cadence.com/whitepapers/cdc⎯wp.pdf.*

* cited by examiner

*Primary Examiner*—Amir Zarabian
*Assistant Examiner*—Michael Weinberg
(74) *Attorney, Agent, or Firm*—Martine Penilla & Gencarella, LLP

(57) ABSTRACT

A method for reading data from a memory module over a bi-directional bus is provided. The method initiates with issuing a read command. Then, a strobe signal is transitioned from a mid-rail state. In one embodiment, the strobe signal is transitioned to a logical low state. A read enable signal is then transitioned prior to a first falling edge of the strobe signal. The strobe signal represents an earliest availability for valid read data being available. The valid read data is read in response to the read enable signal transition. A microprocessor and a system wherein data is read over a bi-directional bus are included.

13 Claims, 4 Drawing Sheets

METHOD AND APPARATUS FOR DATA CAPTURE ON A BI-DIRECTIONAL BUS

BACKGROUND

There is an ongoing quest to reduce the amount of time required to capture memory from an external memory module for processing by a microprocessor. At the same time, there is a competing desire to reduce the pin count in order to more efficiently design the integrated circuit chips from on which a memory module or microprocessor may be defined. Thus, some designs utilize a bi-directional bus between the memory module and the microprocessor. On a bi-directional bus, signal voltages may be held at mid-rail, or floating, in order to more efficiently switch the voltage between digital signal states.

However, holding the signal at the mid-rail state may result in voltage swings to zero or one due to noise on the bus. This increased noise makes it challenging for a memory controller to capture valid data on read cycles while avoiding false clocking due to strobe signals sitting at mid-rail when the bus is not being driven. If a storage element of an input first in first out (FIFO) buffer is enabled at an incorrect time, i.e., when a signal is still at mid-rail, false clocking can occur. The false clocking can result in capturing bad data and bad synchronization of the FIFO write pointer.

One attempt to address this shortcoming was the use of asynchronous FIFOs. However, this scheme required the use of complex/custom logic, which occupied valuable chip real estate. In addition, this custom logic further added to the delay of obtaining the requested data.

In light of the foregoing, it is desirable to implement a scheme for an improved data capture technique across a bi-directional bus that guarantees the availability of the correct data by enabling the input capture logic at the correct time to substantially eliminate false clocking issues.

SUMMARY

Embodiments of the present invention provide a scheme for capturing read data through the utilization of a read enable signal. The present invention can be implemented in numerous ways, including as a process, an apparatus, a system, a device, or a method. Several embodiments of the present invention are described below.

In one embodiment, a method for reading data from a memory module over a bi-directional bus is provided. The method initiates with issuing a read command. Then, a strobe signal is transitioned from a mid-rail state. In one embodiment, the strobe signal is transitioned to a logical low state. A read enable signal is then transitioned prior to a first falling edge of the strobe signal. The strobe signal represents an earliest availability for valid read data being available. The valid read data is read in response to the read enable signal transition.

In another embodiment, a microprocessor is provided. The microprocessor includes a memory controller configured to communicate with external memory over a bi-directional bus. Read capture logic configured to propagate a transition of a read enable signal generated by the memory controller in response to a read command issued by the memory controller is included. The read capture logic causes a delay in the transition of the read enable signal. The delay in the transition of the read enable signal accommodates different latencies associated with strobe signals from the external memory received over the bi-directional bus. The transition of the read enable signal indicates valid data is available for sampling over the bi-directional bus. In one embodiment the external memory is a dual in-line memory module (DIMM).

In yet another embodiment, a system having a programmable delay for reading data across multiple clock domains is provided. The system includes a memory module and a bi-directional bus. A microprocessor reading data from the memory module over the bi-directional bus is included. The microprocessor has a memory controller integrated therein. The memory controller operates according to a memory controller clock domain. The microprocessor further includes read capture logic providing a programmable delay accommodating a latency associated with capturing data from the memory module. The read capture logic is configured to propagate a transition of a read enable signal generated by the memory controller according to the programmable delay.

Other aspects of the invention will become apparent from the following detailed description, taken in conjunction with the accompanying drawings, illustrating by way of example the principles of the invention.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION

An invention is described for a system and method for capturing read data from an external memory. It will be obvious, however, to one skilled in the art, that the present invention may be practiced without some or all of these specific details. In other instances, well known process operations have not been described in detail in order not to unnecessarily obscure the present invention.

The embodiments described herein provide for a register programmable delay to set the latency expected for valid data to return to a memory controller after the controller has issued a read command. The delay governs the time at which the input first-in-first-out (FIFO) buffers become enabled to guarantee that all the data will be captured when the strobe signals are valid. By using a falling edge of the earliest possible strobe signal, the technique provides for a full 1.5 clock cycle window minus related system and chip timing skews.

Figure 1:
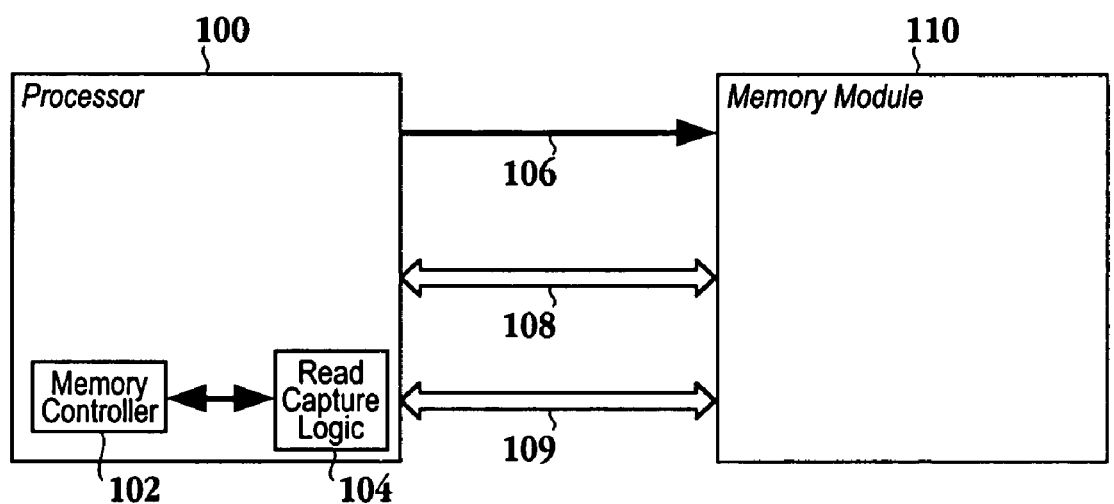
FIG. 1 is a simplified schematic diagram illustrating a system in which a memory controller is able to capture valid data on read cycles while avoiding false clocking due to strobe signals sitting at mid-rail in accordance with one embodiment of the invention.

FIG. 1 is a simplified schematic diagram illustrating a system in which a memory controller is able to capture valid data on read cycles while avoiding false clocking due to strobe signals sitting at mid-rail in accordance with one embodiment of the invention. Processor 100 includes memory controller 102 and read capture logic 104. Processor 100 is in communication with memory module 110 over unidirectional bus 106, bi-directional bus 108, and bi-directional bus 109. It should be appreciated that unidirectional bus 106 carries command and address information from processor 100 to memory module 110. Bi-directional bus 108 is used to carry a strobe signal between memory module 110 and processor 100. For example, where memory module 110 is a double data rate (DDR) device, data strobes (DQS) are non-free running signals that are driven by the device, which is driving the data signals. Thus, processor 100 drives the DQS for write operations, while the memory module drives the DQS for read operations. Because of the bi-directional nature of bus 108, voltages are held at mid-rail to turn it around faster. In order to prevent a false edge to cause the capture of invalid data the embodiments described herein utilize a read enable signal in which a register programmable delay is set to accommodate the latency for the expected return of valid data. Bi-directional bus 109 carries the corresponding requested data associated with a read command issued by processor 100.

Although processor 100 and memory module 110 may operate at the same frequency, the clock associated with memory module 110 is unlikely to be aligned with the clock of the processor. That is, once a read command issues from processor 100, there is a latency associated with the access of data from memory module 110. This latency may be due to the signal routing through memory module 110 to obtain the requested data for placement on bus 109. In essence, the clock domain of processor 100 is different than the clock domain of memory module 110 because of these latencies. As will be explained in more detail below, the read enable signal mentioned above, is generated by the memory controller and propagated through the read capture logic 104 in a manner that will guarantee valid data being available.

In one embodiment, the memory module is a dual in-line memory module (DIMM). One skilled in the art will appreciate that the DIMM may have a plurality of chips, with each chip generating a strobe signal, i.e., a DQS signal, in response to a read request for data associated with the chip. In another embodiment, there are 18 chips within the DIMM, therefore, 18 different DQS signals may be possible.

Figure 2:
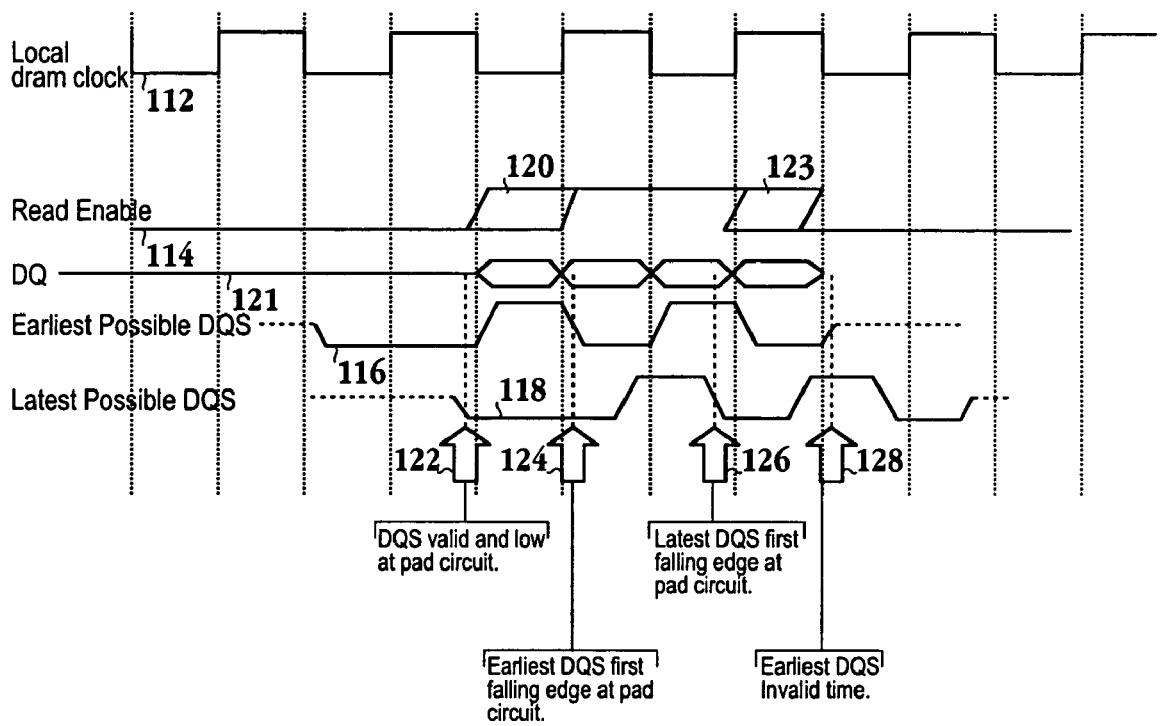
FIG. 2 is a waveform diagram illustrating the timing window capable of being defined through a read enable signal in accordance with one embodiment of the invention.

FIG. 2 is a waveform diagram illustrating the timing window capable of being defined through a read enable signal in accordance with one embodiment of the invention. Waveform signal 112 represents a local memory clock signal for processor 100 of FIG. 1. Read enable signal 114 is generated through the memory controller of the processor. Data strobe signals (DQS) 116 and 118 are driven by the memory module in response to receiving a read request from the processor. Thus, a processor will issue a read command and in response to that read command, the DQS signal is driven from tri-state (mid-rail) to low for a fixed number of cycles. Here, the fixed number of cycles, also referred to as a preamble, is one cycle. However, it should be appreciated that the preamble may be any suitable number of clock cycles. The earliest possible DQS signal 116 represents the shortest length that the signal must travel in order to supply data to be read within memory module 110. The latest possible DQS signal 118 represents the longest length a signal must travel within the memory module. Thus, because of the different lengths in travel, the signals do not arrive simultaneously. In turn, read enable signal 114 is used to guarantee that the storage elements at the input first in, first out (FIFO) buffer are enabled at the correct time. As mentioned above, there may be 18 different DQS signals associated with a DIMM. Therefore, the DQS signals are driven low for the preamble to eliminate noise. The read enable signal is transitioned when an earliest and latest possible DQS signal are guaranteed to be valid.

The difference between the earliest possible DQS signal 116 and the latest possible DQS signal 118 of FIG. 2 represents a worst-case situation, where the latest possible DQS signal is about one clock cycle later than the earliest possible DQS signal. It should be appreciated that if the latest possible DQS signal was moved to the left one cycle and in synchronization with the earliest possible DQS signal, a window of approximately one and a half cycles will be available for transitioning the read enable signal to a high state. However, even in the worst case scenario represented in FIG. 2, a window of approximately a half cycle between the latest possible DQS signal 118 being driven low and the first falling edge of the earliest possible DQS signal is available to transition the read-enable signal to a high state. One skilled in the art will appreciate that the strobe preamble for one clock cycle in which each of DQS signals 116 and 118 are driven low and held may be defined by the Joint Electron Device Engineering Council (JEDEC) double data rate (DDR) specifications. Additionally, by utilizing the first falling edge of the earliest possible DQS signal 116 rather than the first rising edge of the earliest possible DQS signal, an extra half cycle is gained in this design. This allows for an operating margin that is much more robust, even when considering the use of asynchronous FIFOs.

Still referring to FIG. 2, the data associated with earliest DQS signal 116 is represented by line 121. In one embodiment, where the memory module supports a double data rate, four chunks of data are captured, e.g., one at each edge of the strobe signal. Read enable signal 114 remains low until the strobe signals are guaranteed valid and is transitioned to a high logical state prior to the first falling edge of earliest possible DQS signal 116. Thus, region 120 of signal 114 represents the time range that the read enable signal can transition, i.e., between arrow 122 and arrow 124. Read enable signal 114 remains in a logical high state until after latest possible DQS signal 118. That is region 123 of signal 114 represents the time range that the read enable signal can transition to a logical low state, i.e., between arrows 126 and 128. As illustrated in FIG. 2, the post amble for the strobe signals is one half of a clock cycle, which represents the time period that the signal is maintained in a logical low state before returning to a mid-rail voltage. Read capture logic 104 of FIG. 1, sets a programmable delay that triggers the read enable transition, so that the capture FIFOs are enabled when valid data is available over the DQ bus.

Figure 3:
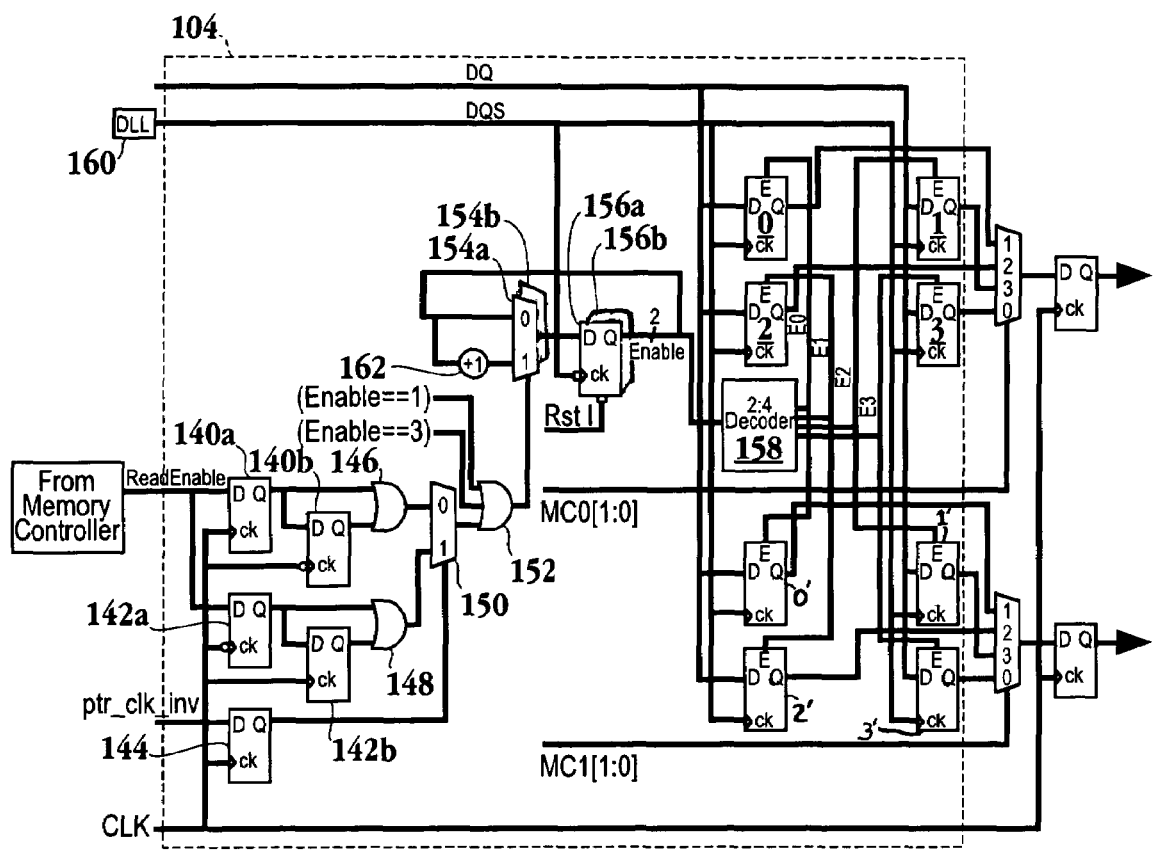
FIG. 3 is a simplified schematic diagram illustrating the structure of the read capture logic in accordance with one embodiment of the invention.

FIG. 3 is a simplified schematic diagram illustrating the structure of the read capture logic in accordance with one embodiment of the invention. The read enable signal from the memory controller is transmitted to storage elements 140a and 142a. The output of storage element 140a is delivered to OR gate 146 and storage element 140b. Storage element 140b eventually supplies a second input to OR gate 146. Likewise, the output of storage element 142a is delivered to OR gate 148 and storage element 142b. The output of storage element 142b is then delivered as an input to OR gate 148. The output of OR gates 146 and 148 are delivered to multiplexor 150. The select signal for multiplexor 150 is the output of storage element 144, which receives a ptr_clk-_inv signal as input. Multiplexor 150 delivers its output to OR gate 152, which additionally includes FIFO enable 1 and enable 3 signals as input. The ptr_clk_inv signal is used to program the read enable signal to a half cycle resolution. The FIFO enable signals are incremented when the read enable signal is asserted or when the read enable value is to one or three. The clock signal for the operation described above is the local clock from the memory controller. It should be appreciated that the logic described above makes the read enable signal valid for at least one and a half cycles.

Still referring to FIG. 3, the output of OR gate 152 is used as a select signal for multiplexor 154a. Multiplexor 154a delivers its output to storage element 156a. The output from storage element 156a will be sent to decoder 158 and returned back to multiplexor 154a. As illustrated, the signal is incremented through module 162 in addition to being fed back to multiplexor 154a. The clock signal for storage element 156a is the strobe signal (DQS) from the memory module. One skilled in the art will appreciate that delay lock loop (DLL) 160 functions to align the skew of the DQS signal to the DQ signal. Decoder 158 will then decode and forward the enable signal to either of the two banks of four storage elements. It should be appreciated that there are two sets of four storage elements, i.e., storage elements 0, 1, 2, and 3 and storage elements 0', 1', 2', and 3', in order to accommodate back-to-back read operations. Thus, multiplexor 154a and 156a are replicated as multiplexor 154b and 156b in order to handle the back-to-back read operations without losing any data. In one embodiment, the counter represented by module 162 is at zero or two until the read enable signal is asserted. This points to enabling the 0 and 0' storage elements, which store data when the DQS signal has a positive and negative transition. Once read enable is asserted the pointer increments thereby enabling the 1 and 1' storage elements to store valid data. It should be appreciated that this counter value is automatically incremented when its value is one or three as the data is in four portions as illustrated with reference to FIG. 2.

In one embodiment, read capture logic 104 allows for timing the read enable signal within one half of a clock cycle through a programmable delay. The read enable signal is eventually issued to increment a pointer within storage elements 156a and 156b. Thus, when the read enable signal has not transitioned to a logical high state, i.e., is not enabled, the pointer is not incremented and will point to a fixed location until valid data is available. For example, the pointer may point to storage element 0 until a valid read enable signal is received, at which time the pointer is incremented to enable each of the four storage elements to receive the corresponding four chunks of data. It should be appreciated that the storage elements described above may be any suitable storage element, such as a flip-flop or a latch. At a later time the controller issues multiplexor select signals to read out the data stored in storage elements 0, 0', 1, 1', 2, 2', 3, 3', 4, and 4' in the order written.

Figure 4:
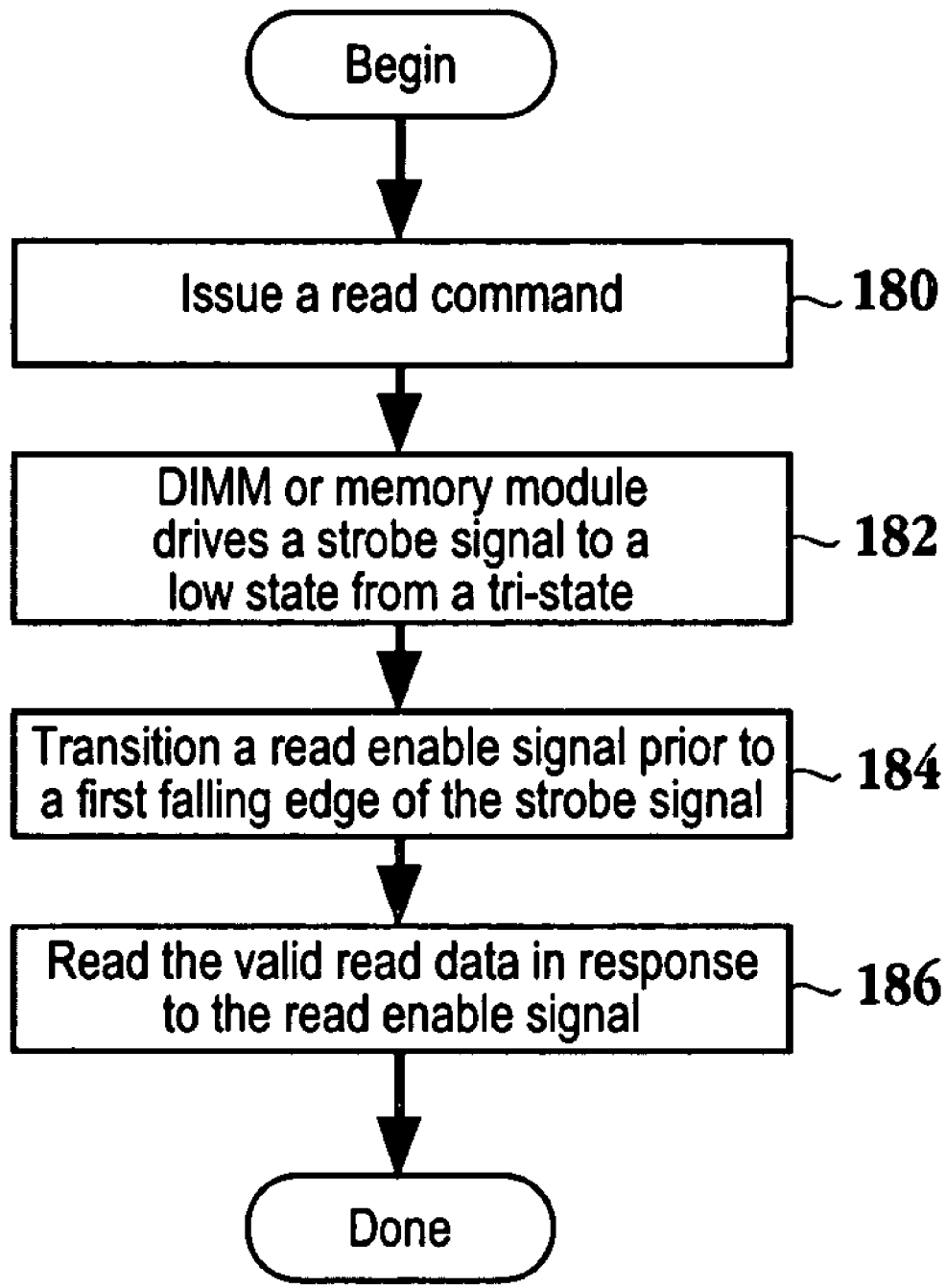
FIG. 4 is a flow chart diagram illustrating the method operations for reading data from a memory module over a bi-directional bus in accordance with one embodiment of the invention.

FIG. 4 is a flow chart diagram illustrating the method operations for reading data from a memory module over a bi-directional bus in accordance with one embodiment of the invention. The method initiates with a read command being issued in operation 180. Here, the read command is issued by a processor, such as, the processor discussed above with reference to FIG. 1. In response to the read command, the DQS signals, also referred to as strobe signals, are driven low from a tri-state for a preamble time frame in operation 182. Here, the DIMM or memory module drives the strobe signal. In one embodiment, the preamble is one clock cycle. The method then advances to operation 184 where a read enable signal is transitioned prior to a falling edge of a strobe signal representing an earliest availability for valid read data being available. By using the falling edge of the earliest available strobe signal, an additional half cycle is gained to define a window during a worst-case situation as represented in FIG. 2. Here, a timing window representing valid read-data being available from the memory module is identified. The timing window is defined by the read enable signal, which is issued as a result of the read command and the first falling edge of the earliest possible DQS signal. The propagation of the read enable signal is delayed through a programmable register delay to accommodate the latency expected for valid data to return to the controller, after the controller has issued a read command. The method then moves to operation 186 where the valid read data is read in response to the read enable signal. With reference to FIG. 3, the read enable signal enables the storage elements to accept the four chunks of data to be eventually read out.

The embodiments described above provide for a simple digital logic that can be easily designed and validated with standard tool flows as opposed to analog designs previously used for the asynchronous control. This logic will take less area on the silicon, thereby freeing more area for other uses. In addition, by using the falling edge of the earliest available strobe signal, a wider timing window is defined for greater flexibility and system implementation. The design is deterministic and gives better repeatability since it is entirely governed by programmable delays as opposed to sensing voltages.

In summary, the proposed technique substantially eliminates the capturing of invalid data through the use of a read enable signal. The read enable signal is delayed after a read command is issued in order to guarantee that valid data is captured. It should be appreciated that while the above embodiments refer to DDR type memory interfaces, the invention is not limited to these embodiments. That is, the embodiments described above may be expanded to any suitable bi-directional Input/Output interface. Additionally, the processor referred to herein may be a general processor or a processor designed for a specific purpose. In one embodiment, the processor is the NIAGRA™ family of processors owned by the assignee.

With the above embodiments in mind, it should be understood that the invention may employ various computer-implemented operations involving data stored in computer systems. These operations include operations requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Embodiments of the present invention can be processed on a single computer, or using multiple computers or computer components which are interconnected. A computer, as used herein, shall include a standalone computer system having its own processor, its own memory, and its own storage, or a distributed computing system, which provides computer resources to a networked terminal. In some distributed computing systems, users of a computer system may actually be accessing component parts that are shared among a number of users. The users can therefore access a virtual computer over a network, which will appear to the user as a single computer customized and dedicated for a single user.

The above-described invention may be practiced with other computer system configurations including hand-held devices, microprocessor systems, microprocessor-based or programmable consumer electronics, minicomputers, mainframe computers and the like. The invention may also be practiced in distributing computing environments where tasks are performed by remote processing devices that are linked through a communications network.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A microprocessor, comprising:
   a memory controller configured to communicate with external memory over a bi-directional bus; and
   read capture logic configured to propagate a transition of a read enable signal generated by the memory controller in response to a read command issued by the memory controller, the read capture logic causing a delay in the transition of the read enable signal, the delay in the transition of the read enable signal accommodating different latencies associated with strobe signals from the external memory received over the bi-directional bus, wherein the transition of the read enable signal indicates valid data is available for sampling over the bi-directional bus, the read capture logic including first and second storage elements configured to receive the read enable signal, the first storage element providing an output signal to a first OR gate and a third storage element, the third storage element providing output to the first OR gate.

2. The microprocessor of claim 1, wherein the different latencies associated with strobe signals from the external memory creates an earliest available strobe signal and a latest available strobe signal.

3. The microprocessor of claim 1 wherein
   the second storage element provides an output signal to a second OR gate and a fourth storage element, the fourth storage element providing output to the second OR gate.

4. The microprocessor of claim 3, wherein the read capture logic further includes,
   a first multiplexor receiving an output signal from the first OR gate and an output signal from the second OR gate, wherein an output signal from the multiplexor is received by a third OR gate.

5. The microprocessor of claim 4, wherein the read enable signal propagates through the storage elements according to a memory controller clock domain.

6. The microprocessor of claim 4, wherein output from the third OR gate functions as an enable signal for a second multiplexor, the second multiplexor providing input to a fifth storage element, the second multiplexor and the fifth storage element propagating signals according to a strobe signal of the external memory.

7. The microprocessor of claim 6, wherein the second multiplexor and the fifth storage element are replicated to accommodate sequential read operations.

8. A system having a programmable delay for reading data across multiple clock domains, comprising:
   a memory module;
   a bi-directional bus; and
   a microprocessor reading data from the memory module over the bi-directional bus, the microprocessor having a memory controller integrated therein, the memory controller operating according to a memory controller clock domain, the microprocessor including read capture logic providing a programmable delay accommodating a latency associated with capturing data from the memory module, the read capture logic configured to propagate a transition of a read enable signal generated by the memory controller according to the programmable delay, wherein the propagation of the transition of the read enable signal occurs across multiple clock domains, the read capture logic including first and second storage elements configured to receive the read enable signal, the first storage element providing an output signal to a first OR gate and a third storage element, the third storage element providing output to the first OR gate, the second storage element providing an output signal to a second OR gate and a fourth storage element, the fourth storage element providing output to the second OR gate.

9. The system of claim 8 wherein the multiple clock domains include the memory controller clock domain and a domain of a strobe signal received from the memory module over the bi-directional bus.

10. The system of claim 8, wherein the read enable signal is utilized to indicate a timing window for reading four data portions over the bi-directional bus.

11. The system of claim 8, wherein a portion of the read capture logic is replicated to accommodate successive read operations.

12. The system of claim 8, wherein the programmable delay guarantees data retrieved according to an earliest possible strobe signal of the memory module and data retrieved according to a latest possible strobe signal of the memory module are both available.

13. The system of claim 8, wherein the memory module is a dual in-line memory module.

* * * * *